United States Patent
Heyers et al.

(10) Patent No.: US 6,724,023 B2
(45) Date of Patent: Apr. 20, 2004

(54) FIELD EFFECT TRANSISTOR, ESPECIALLY FOR USE AS A SENSOR ELEMENT OR ACCELERATION SENSOR

(75) Inventors: Klaus Heyers, Reutlingen (DE); Bernhard Elsner, Huenfelden (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/838,062

(22) Filed: Apr. 19, 2001

(65) Prior Publication Data

US 2002/0005530 A1 Jan. 17, 2002

(30) Foreign Application Priority Data

Apr. 19, 2000 (DE) .......................... 100 19 408

(51) Int. Cl.[7] .............................................. H01L 29/84
(52) U.S. Cl. ........................ 257/254; 257/252; 257/417; 257/419; 257/420
(58) Field of Search ................ 257/252, 254, 257/415, 417, 419, 420

(56) References Cited

U.S. PATENT DOCUMENTS

| 5,503,017 | A |   | 4/1996  | Mizukoshi |
|-----------|---|---|---------|-----------|
| 5,504,356 | A | * | 4/1996  | Takeuchi et al. ............ 257/254 |
| 5,572,057 | A | * | 11/1996 | Yamamoto et al. ......... 257/417 |
| 5,627,397 | A | * | 5/1997  | Kano et al. ................ 257/417 |
| 5,895,851 | A | * | 4/1999  | Kano et al. ................ 73/1.37 |

FOREIGN PATENT DOCUMENTS

| DE | 43 39 190 A1 | 5/1994 |
|----|--------------|--------|
| DE | 44 45 553 A1 | 6/1995 |
| DE | 195 09 160 A1 | 9/1995 |
| DE | 195 09 338 A1 | 9/1995 |
| DE | 44 18 163 | 11/1995 |
| DE | 195 42 799 A1 | 5/1996 |
| DE | 196 37 265 | 3/1998 |
| DE | 197 19 601 | 11/1998 |
| DE | 197 19 601 A1 | 11/1998 |
| DE | 197 32 250 | 1/1999 |
| DE | 198 44 676 C1 | 8/2000 |
| JP | 4-25764 | 1/1992 |

OTHER PUBLICATIONS

Abstract of Japanese patent application No. 0 516 7152.

* cited by examiner

Primary Examiner—Tom Thomas
Assistant Examiner—N. Drew Richards
(74) Attorney, Agent, or Firm—Kenyon & Kenyon

(57) ABSTRACT

A field effect transistor suited for use as a sensor element or in an acceleration sensor is described. For this purpose, the field effect transistor within a planar substrate has a drain area and a source area, which are separated from each other by a channel region. In addition, a gate electrode is provided which is arranged so as to be substantially self-supporting above the substrate over the channel region. The gate electrode is flexibly supported such that an external force acting upon it which has a component acting parallel to the surface of the substrate causes a deflection of the gate electrode parallel to the surface of the substrate. A method is also described in which, in a first method step, an integrated circuit having a drain area, a source area, and a channel region is manufactured or made available in a CMOS process, and thereafter, in a second method step, the substantially self-supporting gate electrode is produced on the integrated circuit using electroplating additive technology.

17 Claims, 5 Drawing Sheets

FIELD EFFECT TRANSISTOR, ESPECIALLY FOR USE AS A SENSOR ELEMENT OR ACCELERATION SENSOR

FIELD OF THE INVENTION

The present invention relates to a field effect transistor (FET), especially for use as a sensor element or in an acceleration sensor, a method for its manufacture, and a sensor element of this type according to the species of the independent claims.

BACKGROUND INFORMATION

Acceleration sensors, or inertial sensors, are widely known. In this context, in addition to precision conceptual approaches, there are also micromechanical conceptual approaches, in which both discrete components as well as components integrated in semiconductor circuits are conventional.

One example of an acceleration sensor of this type is described in U.S. Pat. No. 5,503,017. In this acceleration sensor, two FETs, opposite each other, are provided within a semiconductor substrate in the area of a recess in this substrate. The FETs have a common gate electrode substantially filling up the recess. Under the influence of an external force acting upon this acceleration sensor, and the gate electrode, the result is a change in the distance between the gate electrode and the two channel regions of the FETs opposite each other, a reduction in the distance between the gate electrode and one of the channel regions corresponding to an increase in the distance regarding the other channel region. In this manner, it is possible in principle to measure one component of this external force.

In addition, in the Japanese Patent Application No. 4-25764, whose content is summarized in U.S. Pat. No. 5,503,017, an acceleration sensor is described which is based on an FET. A substrate is furnished with a drain area and a source area, which are separated from each other by a channel region. Furthermore, in that publication, a process of mounting a substantially self-supporting, flexibly supported gate electrode above the channel region, the gate electrode being separated by a gap from the channel region in the planar substrate below is described. In this context, under the influence of an external force acting perpendicular to the surface of the substrate, the result is a reduction in the width of the gap and therefore a change in the drain current in the FET. In this manner, this component of the external force acting perpendicular to the surface of the substrate can be detected via the measured current.

In addition to the micromechanical conceptual approaches discussed above for acceleration sensors, conventional acceleration sensors are manufactured using electroplating additive technology. In this regard, reference should be made, for example, to German Patent Application No. 196 37 265 or German Patent Application No. 197 19 601.

The method for manufacturing acceleration sensors of this type, i.e., the electroplating additive technology itself, is described in German Patent No. 44 18 163 and in German Patent Application No. 197 32 250.

SUMMARY

An FET according to the present invention and a sensor element according to the present invention, having at least one FET of this type, has the advantage that the acceleration to be measured does not first have to be transformed into a motion, and then into a change in capacitance, and finally into a change in voltage. Instead, the motion of the gate electrode employed as the inert mass in the FET is converted directly into an easily measurable change in the drain current of the FET.

Furthermore, the FET according to the present invention has the advantage that the deflection of the gate electrode from the neutral position, acting at least approximately parallel to the surface of the substrate, is at least approximately linear with respect to a component of an impinging external force acting parallel to the surface of the substrate. In this manner, the disadvantage is removed that attaches to the conventional acceleration sensors that are based on a capacitive evaluation principle, namely that a nonlinearity exists in principle between the capacitance signal and the acceleration or deflection signal of the inert mass. Furthermore, the capacitance swings arising in acceleration sensors functioning on the basis of the capacitance evaluation principle are usually very small, so that demands that are difficult to satisfy must be placed upon the unit that transforms change in capacitance into change in voltage as well as upon the design and the bonding technology in acceleration sensors of this type. These demands do not apply to FETs according to the present invention.

Rather, in the case of FETs according to the present invention, the sensor signal advantageously exists directly as a current or voltage signal, and does not need to be transformed as a change in capacitance first into a voltage signal, as is usually the case. In this manner, particularly high sensitivities and resolutions can be obtained in the FET according to the present invention or in the sensor element according to the present invention, because interfering parasitic effects, such as noise, are significantly suppressed.

The FET according to the present invention is significantly simpler in its design and is more reliable and simpler than the conventional concepts with regard to evaluating the measuring signal.

Finally, the FET according to the present invention and the method for manufacturing it according to the present invention have the advantage that the FET, including the gate electrode, can be manufactured in one standard CMOS process, and that for manufacturing the necessary integrated circuits (IC) conventional ICs can be used which have been manufactured previously in a separate, generally conventional standard CMOS process. To this extent, a conventional IC for FETs can be initially used advantageously as the substrate, on which, after the IC has also been manufactured using a generally conventional electroplating additive technology, the substantially self-supporting gate electrodes are additionally mounted in the form of movable, acceleration-sensitive structures, along with corresponding contacts and anchoring points.

In this manner, the FET according to the present invention can advantageously be produced in a very cost-effective manner as a fully integrated component, using a manufacturing method that is compatible with the process steps of a CMOS process as well as with so-called electroplating "back end" additive technology.

Thus, it is particularly advantageous that the sensitivity of the sensor element, and of the FET, can easily be adjusted with respect to the forces to be measured, i.e., accelerations, using the geometry of the springs, or spring structures, employed to achieve the substantially self-supporting suspension of the gate electrode. Furthermore, using the geometry of the springs and/or the spring structures, as well as using the thickness of the gate electrode and thus its inert mass, it is possible in a simple way to eliminate or minimize the transverse sensitivity of the FET, and of the sensor element, in a non-detection direction. In this way, it can be achieved that the gate electrode, under the influence of an external force, can be deflected only in one direction, which is oriented parallel to the surface of the substrate.

In particular, it is therefore possible, on the basis of the dimensions of the springs, or of the spring structures, and on the basis of the suspension of the gate electrode, to substantially avoid the width of the gap between the gate electrode and the channel region beneath changing under the influence of an impinging external force which especially has a component acting perpendicular to the surface of the substrate.

Furthermore, it is particularly advantageous if the gate electrode is supported by springs in a self-supporting manner such that in response to an external force, i.e., acceleration, acting upon the gate electrode, the overlapping surface of gate electrode and channel region, as seen in a top view of the gate electrode, changes at least approximately in a linear fashion with respect to a component of this external force acting parallel to the surface of the substrate. The characteristic curve of the FET, or sensor element, i.e., for example, the drain current as a function of the acceleration or of the external force, is therefore linear, given a suitable design of the gate electrode voltage applied, so that no additional circuit-engineering linearization is necessary.

Finally, the FET according to the present invention also makes it possible very advantageously to compensate for temperature fluctuations that arise. This is achieved, on the one hand, by a suitably designed spring structure, which connects the springs supporting the gate electrode in each case with their anchoring points, or, on the other hand, two FETs, arranged so as to be adjoining, are provided with a common gate electrode as the inert mass, the sum, in a top view, of the surface of the gate electrode overlapping the channel region of the first FET and the surface of the gate electrode overlapping the channel region of the second FET remaining at least approximately constant. In this manner, it is possible to suppress temperature fluctuations that may arise, or temperature dependencies of a sensor element of this type, effectively and without additional expense for circuitry.

Furthermore, it is also advantageous if, for increasing (stepping up) the measuring signal, i.e., the drain current for example, a plurality of FETs according to the present invention are connected in parallel.

Finally, it is advantageous that the FET according to the present invention is suitable not only for use in acceleration sensors, but also for use in other inertial sensors such as acceleration switches or rpm sensors or combinations thereof. Thus, the sensor element according to the present invention can be used, for example, also in restraint systems for motor vehicles, or in machine monitoring, it being marked by low manufacturing costs, high reliability, and long service life.

DETAILED DESCRIPTION

Figure 1:
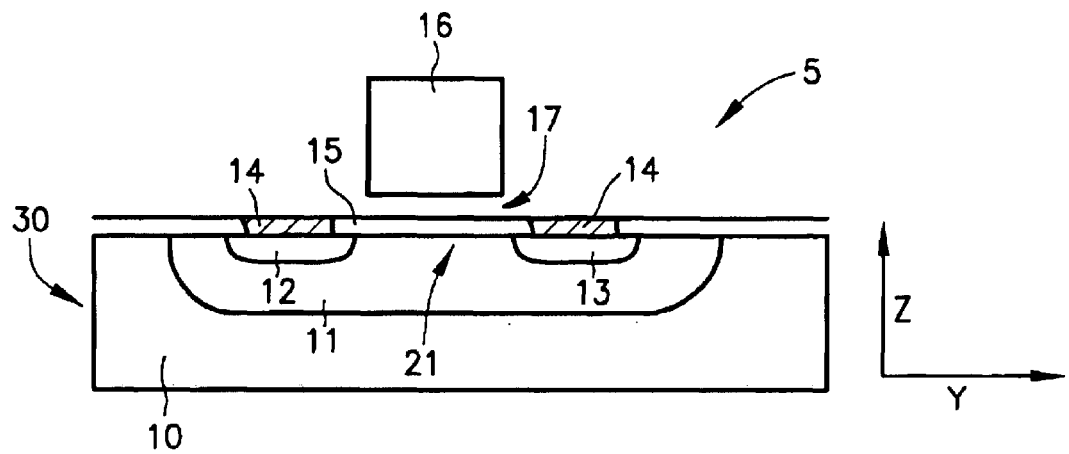
FIG. 1 depicts a section of a first exemplary embodiment of an FET according to the present invention.

FIG. 1 shows a first exemplary embodiment of an FET according to the present invention, which can be used in an acceleration sensor. For this purpose, a $P^+$-type silicon area 11 is produced in a conventional manner on a substrate 10 in the form of a silicon wafer. Further, within this $P^+$-type silicon area 11 on the surface of substrate 10, a drain area 12 and a source area 13 are produced, which partially constitute the surface of substrate 10. Drain area 12 and source area 13 are each made of $N^+$-type silicon. As a whole, substrate 10 having the areas generated therein therefore constitutes an integrated circuit 30 (IC). With respect to further details regarding this integrated circuit 30, which is conventional with regard to design as well as to manufacturing method and that is the basis of an FET, reference should be made, for example, to U.S. Pat. No. 5,503,017. The integrated circuit 30 in this respect can be manufactured entirely in one standard CMOS process.

Furthermore, on integrated circuit 30 on the surface of substrate 10, at least in the area between drain area 12 and source area 13, i.e., so-called channel region 21, a thin insulating layer or passivation layer 15 is applied. In addition, in drain area 12 and in source area 13 on the surface of substrate 10, in each case, a terminal pad 14 is provided which is used for contacting and electrically connecting drain area 12 and source area 13 to further external components, for example a voltage source.

Insulation layer 15 in the exemplary embodiment is an electrically insulating silicon oxide layer. However, in principle, other electrically insulating passivation layers can also be suitable as insulating layer 15. Insulating layer 15 may also be configured such that it extends, at least in certain areas, into drain area 12 and source area 13. In this manner, a short-circuit during operation between gate electrode 16, which has yet to be applied, and drain area 12 and source area 13 is avoided.

After insulating layer 15 and terminal pad 14 have been produced in areas on the surface of substrate 10 using a suitable masking or structuring process, then, i.e., in a so-called "back-end" process, an at least substantially self-supporting gate electrode 16 is produced on already finished integrated circuit 30, using an electroplating additive technology, the gate electrode being arranged above substrate 10 over at least one area of channel region 21.

The process of generating this gate electrode 16 on integrated circuit 30, previously manufactured in a standard CMOS process, is further discussed in detail in connection with FIG. 4a through FIG. 4g.

Ultimately, after manufacturing substantially self-supporting, flexibly supported gate electrode 16, a gap 17 arises between gate electrode 16 and insulating layer 15 situated in channel region 21, the gap having a defined width of 100 nm to 1000 nm, preferably 200 nm to 500 nm.

Figure 2:
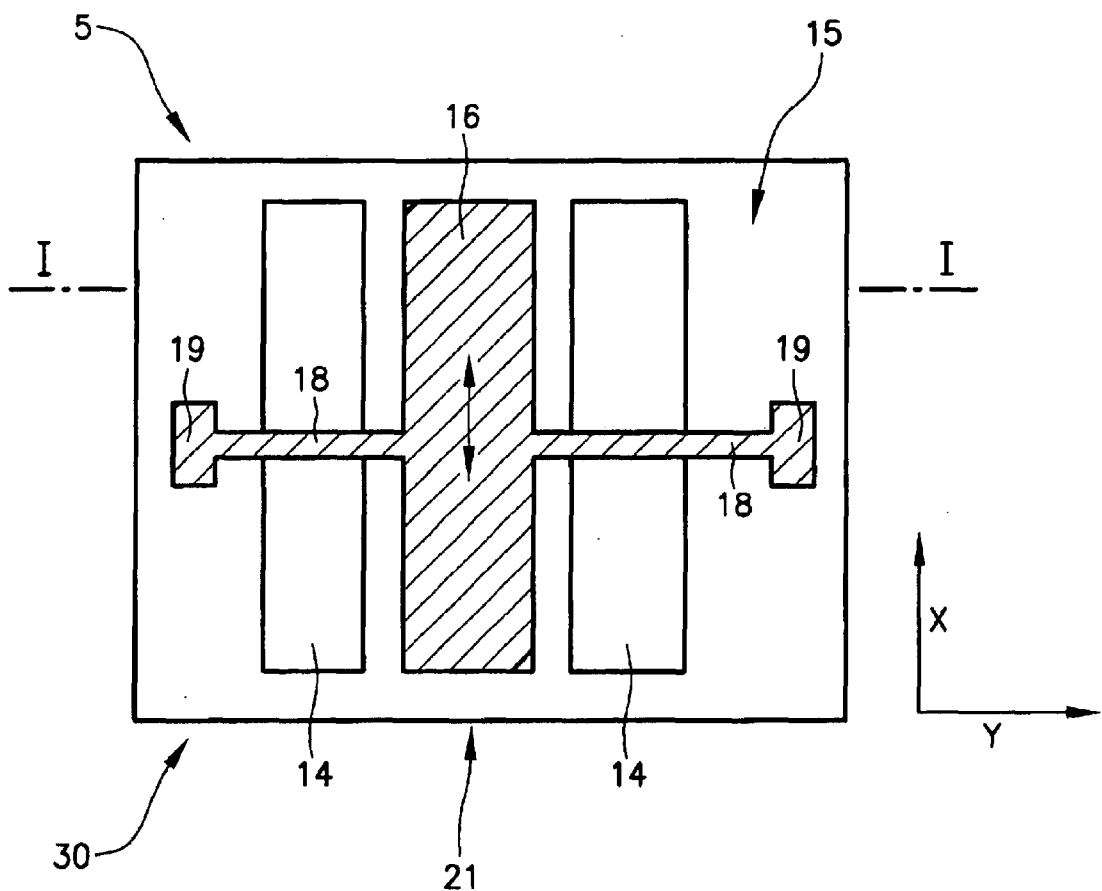
FIG. 2 depicts a top view of FIG. 1.

FIG. 2 depicts a top view of FIG. 1, the section line in accordance with FIG. 1 being additionally indicated in FIG. 2. Also, as is shown in FIG. 2, gate electrode 16 is flexibly supported above integrated circuit 30 so as to be substantially self-supporting and that it has a rectangular shape in the example discussed, so that gate electrode 16 substantially covers channel region 21 between drain area 12 and source area 13. Gate electrode 16 preferably covers channel region 21 completely in a top view, i.e., its surface in a top view approximately conforms to the surface of channel region 21.

In this context, gate electrode 16 has a typical width of 200 µm to 500 µm, a typical length of 200 µm to 1000 µm, and a typical thickness of 200 µm to 1000 µm.

It is further provided in FIG. 2 that gate electrode 16, via two springs 18 that are located on a common axis and opposite each other, is connected to substrate 10 by two anchoring points 19, assigned in each case to these springs 18. To this extent, gate electrode 16 is flexibly supported via springs 18 and by anchoring points 19 and is held over channel region 21 so as to be at least substantially self-supporting. In order to avoid, under the influence of an external force, especially a force having a component that is perpendicular to the surface of substrate 10, the width of gap 17 being changed by this external force, it is also provided that springs 18 have a clearly greater thickness than width, i.e., a high aspect ratio (ratio of thickness to width) of, for example, more than five. In this manner, it is achieved that gate electrode 16, under the influence of an external force that has a component acting parallel to the surface of substrate 10, can be easily displaced parallel to the surface of substrate 10 in the direction of the double arrow indicated in FIG. 2, but also that the width of gap 17, in every operating state, i.e., in response to virtually any external force, always remains at least constant.

Gate electrode 16 according to FIG. 2 therefore constitutes the inert mass of an acceleration sensor 5 on the basis of the FET discussed and is suitable for measuring an external force acting parallel to the surface of substrate 10, in the direction of the double arrow in FIG. 2. In this context, the overlapping surface, as seen in a top view of substrate 10, of the area of channel region 21 covered by gate electrode 16 is directly proportional to the direction, indicated by the double arrow, of the component of the impinging external force acting parallel to the surface of substrate 10. In particular, this overlapping surface changes in linear fashion as a function of this force component and therefore in a linear fashion as a function of the acceleration acting in this direction. Since, on the other hand, the drain current, i.e., the electrical current that can be drawn from drain area 12, is directly proportional to the overlapping surface, i.e., to the surface of channel region 21 that, in a top view, is covered by gate electrode 16, the result is a direct measurement, i.e., conversion of the impinging acceleration into an electrical current.

Gate electrode 16, springs 18, and anchoring points 19 are generally preferably metallic. Their manufacture is discussed below on the basis of FIGS. 4a through 4g.

The lateral geometry of gate electrode 16 can be selected in virtually any shape, i.e., its shape is not limited to the rectangular shape discussed. Furthermore, springs 18, in addition to simple bars, can also be realized in a T-shape or a Π-shape or even in other, more complicated structures. The purpose of springs 18 in this context is, in each case, that gate electrode 16 at at least one location on substrate 10 is anchored by at least one spring 18 to at least one anchoring point 19 and therefore is coupled electrically and mechanically to substrate 10, i.e., to integrated circuit 30. In this context, it should be kept in mind that the geometry of springs 18 as well as, in particular, the thickness of springs 18 and the thickness of gate electrode 16 define the mechanical properties of sensor element 5. This relates to the sensitivity of sensor element 5 with regard to the direction of the impinging external force, i.e., the direction of the individual components of this force. Furthermore, the linearity of the measuring signal as a function of the acceleration to be measured as well as also the temperature dependency of sensor element 5 are influenced by the design of springs 18 and anchoring points 19. This is discussed further in connection with FIG. 3.

Figure 3:
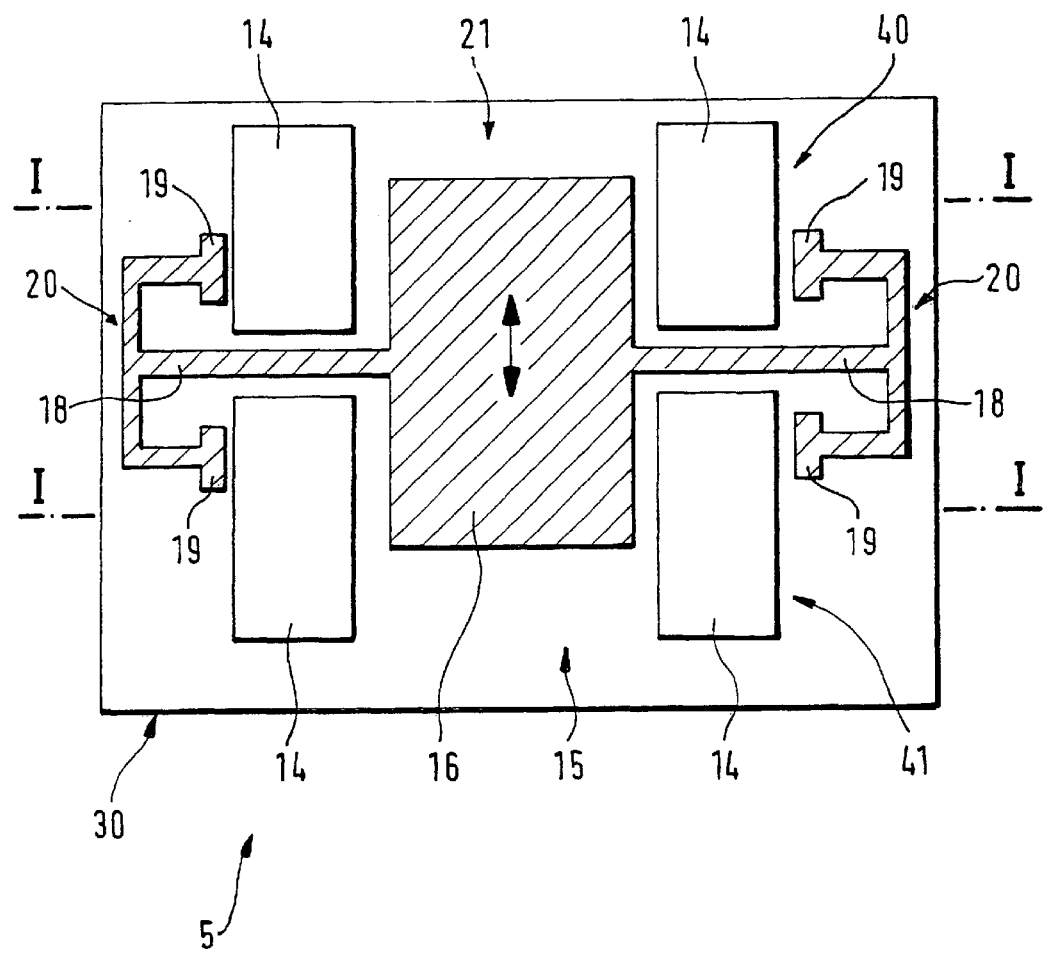
FIG. 3 depicts a top view of a sensor element having two FETs, arranged next to each other and having a common gate electrode.

FIG. 3 depicts a second exemplary embodiment of sensor element 5, two FETs 40, 41 being provided so as to be arranged next to each other and integrated in a common integrated circuit 30 so as to have a common gate electrode 16 as an inert mass, for use in an acceleration sensor. Furthermore, it is provided in accordance with FIG. 3 that common gate electrode 16 is arranged such that, under the influence of an external force which has especially a component oriented in the direction of the double arrow parallel to the surface of integrated circuit 30, and of substrate 10, the sum of the surface of gate electrode 16 overlapping channel region 21 of first FET 40 and the surface of gate electrode 16 overlapping channel region 21 of second FET 41 remains at least approximately constant. In this context, the overlapping area is seen in each case in a top view on sensor element 5. Furthermore, it is indicated in FIG. 3 that, in a section along the two indicated sectional lines, a sectional view according to FIG. 1 would result in each case.

It also provided in FIG. 3 that electrode 16 is connected to substrate 10 by two springs 18, arranged opposite each other on a common axis, the springs having a total of four anchoring points 19. In this context, an additional spring structure 20 is situated in each case between spring 18 and the two assigned anchoring points 19. This spring structure 20 brings about a significant reduction in the temperature dependency of the measuring signal of sensor element 5 according to FIG. 3. In this context, it should be emphasized that spring structures 20 shown in FIG. 3 should only be understood as examples and that there are many variants with respect to the concrete structure of springs 18, the configuration of spring structures 20, and the number and arrangement of anchoring points 19, which the worker skilled in the art must determine in the individual case on the basis of the specific demands to be placed on a specific sensor element 5.

Common gate electrode 16 according to FIG. 3 also results in compensating for temperature fluctuations, or temperature dependencies of the measuring signal of sensor element 5, since in response to a temperature fluctuation of this type leading to a lateral shifting of gate electrode 16, the sum of the overlapping surfaces of two FETs 40, 41 always remains constant.

In FIGS. 1 through 3 discussed above, no explanation is provided of the details regarding the electrical interconnection and the evaluation of the measuring signals of the FETs, because these are well known to the worker skilled in the art.

FIGS. 4a through 4f show the method for manufacturing an FET, or a sensor element 5 according to FIGS. 1 through 3, by way of example using the case of manufacturing a flexibly supported, at least substantially self-supporting gate electrode 16 and an anchoring point 19 mounted on substrate 10.

Figure 4A:
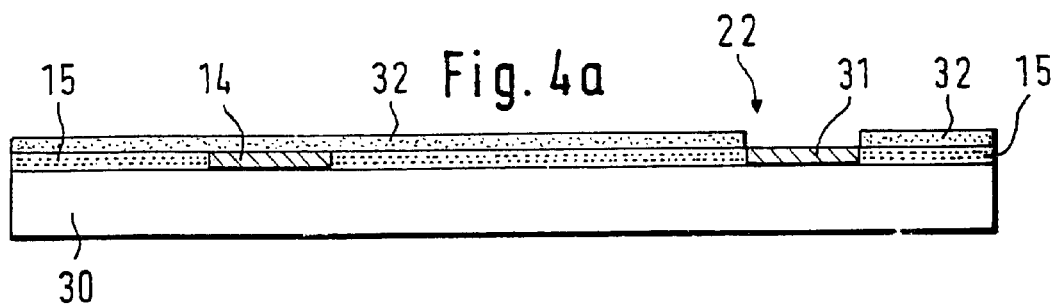
FIG. 4a through FIG. 4g depict the method for manufacturing an FET according to FIG. 2, or a sensor element according to FIG. 3.

FIG. 4a, in this regard, proceeds initially on the basis of a generally conventional integrated circuit 30, which has been manufactured in a standard CMOS process. On its surface, insulating layer 15 is produced in the form of a silicon oxide layer, using a suitable patterning process, the insulating layer having a thickness of, for example, 100 nm. In addition, on the surface of integrated circuit 30, in the areas not taken up by insulating layer 15, terminal pads 14 are produced for the electrical contacting, i.e. interconnection, the terminal pads also having a thickness of roughly 100 nm and being made of a metal such as aluminum.

Furthermore, for manufacturing gate electrode 16, in contrast to the conventional methods for manufacturing FETs, the gate electrode is not applied in the form of a polysilicon electrode, but rather is generated using electroplating additive technology. To this extent, it is a question in this case of a so-called "back end" process carried out on the already prepepared integrated circuit 30.

As shown in FIG. 4a, in the context of this additive technology, a first photo-resist layer 32 is initially applied to insulating layer 15 and terminal pads 14, the photo-resist layer defining a polymer sacrificial layer and, after being removed in a later method step, then determining the width of gap 17.

In this connection, it is advantageous to planarize the surface of integrated circuit 30 before applying first photo-resist layer 32, in order to be able to adjust the width of gap 17 more precisely. Suitable as a method for the planarizing is, for example, a chemical-mechanical polishing. On integrated circuits 30 polished in this way, and on surfaces of insulating layer 15 and of terminal pads 14 polished in this way, it is then possible to apply first photo-resist layer 32 at a particularly precisely defined thickness, the precision of the adjusted thickness being roughly 1%.

After first photo-resist layer 32 is applied, it is initially patterned photolithographically, once again removed in the area of a first recess 22, and finally tempered. In this context, first recess 22 forms the area which later will be taken up by anchoring point 19. For this purpose, it is additionally provided that in the area of recess 22 on the surface of integrated circuit 30 a metallic anchoring surface 31 has been produced previously, i.e., already during the preceding manufacture of integrated circuit 30, the metallic anchoring surface having been designed and generated by analogy to terminal pads 14. In particular, this anchoring surface 31 is used to interconnect anchoring point 19, which is subsequently applied thereon, which then assures the electrical contacting of gate electrode 16, which is connected to anchoring point 19 via spring 18 so as to be at least substantially self-supporting.

In this connection, first photo-resist layer 32, in addition to establishing the width of gap 17 in the further method steps, also makes it possible to expose gate electrode 16.

Figure 4B:
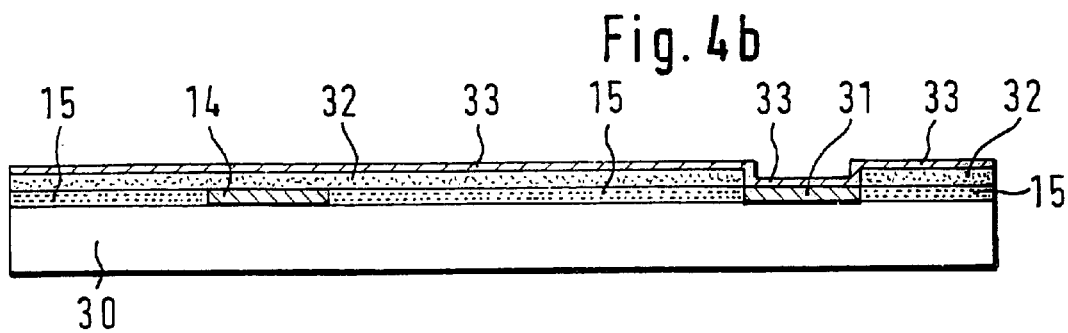

FIG. 4b depicts a method step following that of FIG. 4a, a metal layer 33, as an electroplating starting layer, having been deposited by sputtering onto first photo-resist layer 32 and anchoring surface 31. Specifically, metal layer 33 is a conductive layer made of chromium and copper, roughly 300 nm thick. In this context, the initially sputtered chromium is used as an adhesion layer to first photo-resist layer 32 situated beneath, whereas the subsequently sputtered copper is used as the starting layer for an electroplating deposition.

Figure 4C:
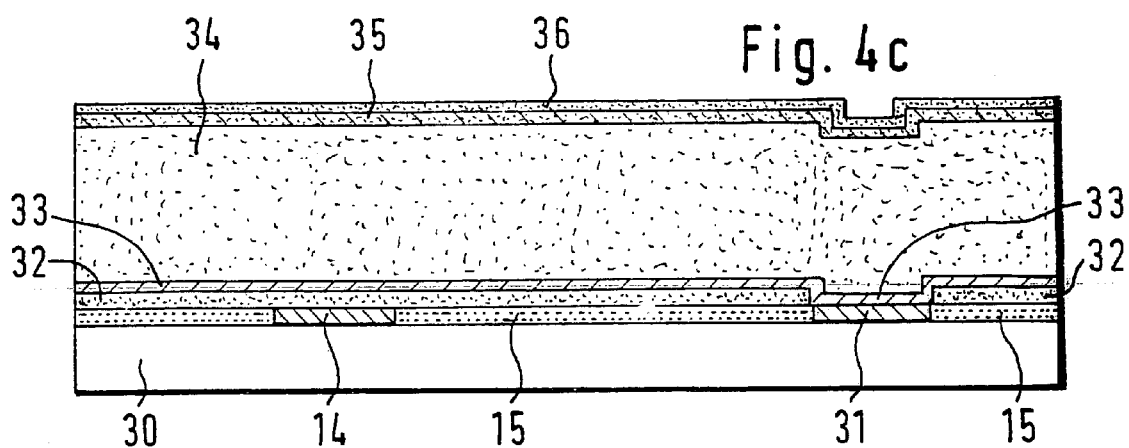

After the deposition of metal layer 33, then, in accordance with FIG. 4c, a roughly 15 mm thick, second photo-resist layer 34 is deposited on metal layer 33. This second photo-resist layer 34 is applied, for example, by spinning and is then cured at 200° C. Finally, on the surface of second photo-resist layer 34, a roughly 600 nm thick oxide layer 35 made of silicon oxide is deposited using a conventional plasma CVD method. This silicon oxide is used as a hard-surface mask for patterning second photo-resist layer 34 located beneath, and it itself is also initially patterned using a photolithographic process and a subsequent plasma etching.

Figure 4D:
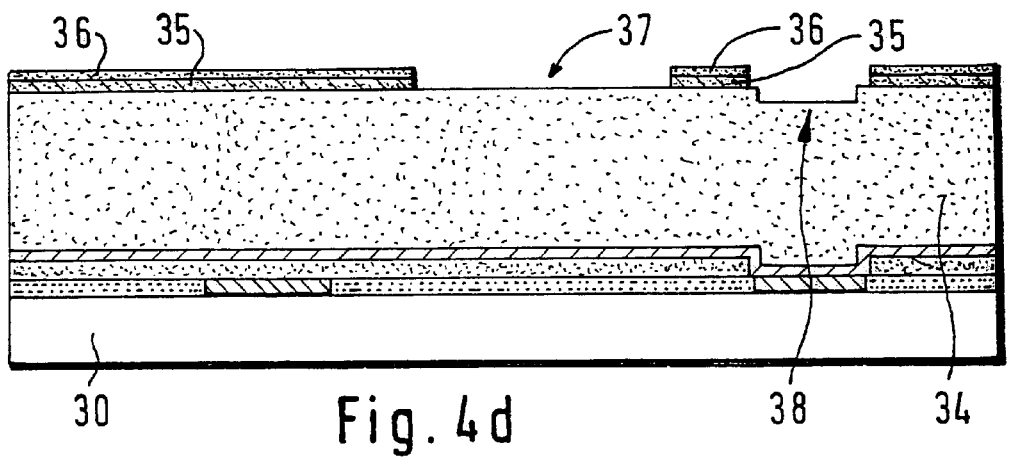
Figure 4E:
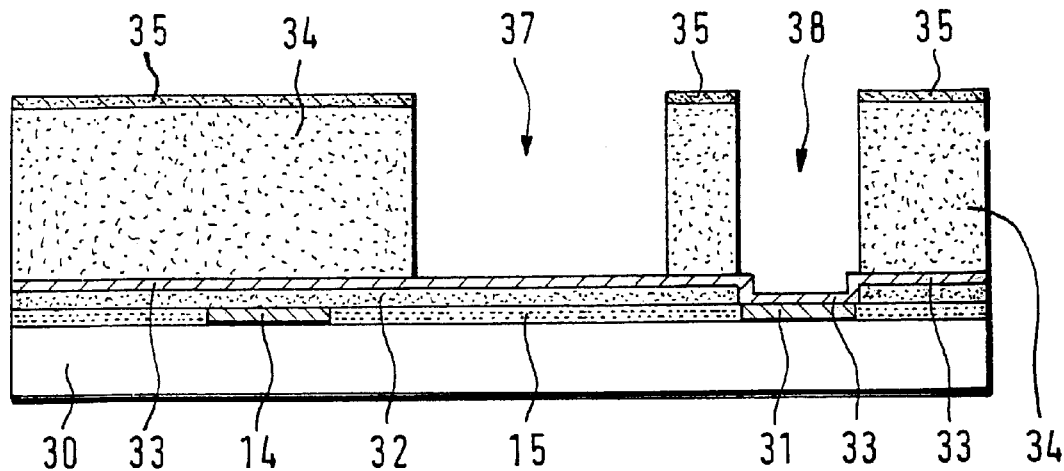

For this purpose, a third photo-resist layer 36 is initially applied to oxide layer 35 and is patterned such that in third photo-resist layer 36 a second recess 37 and a third recess 38 arise. In this context, third recess 38 is arranged above anchoring surface 31, whereas second recess 37 defines the location and the shape of gate electrode 16 to be produced subsequently. After the aforementioned patterning process of third photo-resist layer 36, oxide layer 35 according to FIG. 4d is opened in the area of second recess 37 and of third recess 38. Subsequently, according to FIG. 4e, second photo-resist layer 34 is etched in the area of second recess 37 and of third recess 38, using a generally conventional, anisotropic plasma etching process, so that trenches arise that extend down to metal layer 33.

Figure 4F:
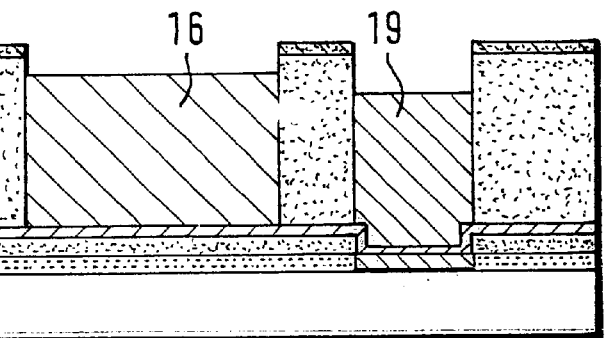

Subsequently, a roughly 10-μm-thick nickel layer is deposited into the polymer negative shape that arises in this manner and that is bordered by second photo-resist layer 34, patterned in the manner discussed above, and by metal layer 33, so that in accordance with FIG. 4f, gate electrode 16 and anchoring point 19 are produced. In this context, as the method for depositing the aforementioned nickel layer, an electroplating deposition method is used, metal layer 33 being used as the so-called "plating base."

Figure 4G:
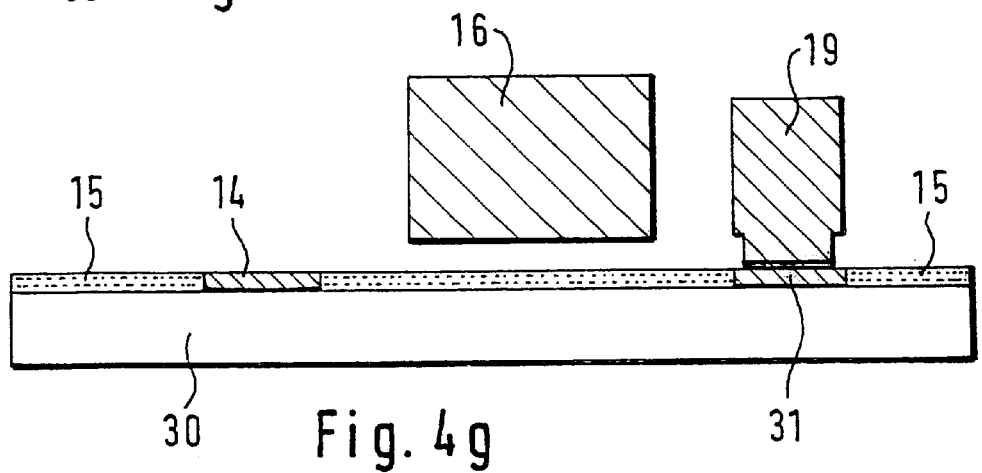
Figure 5:
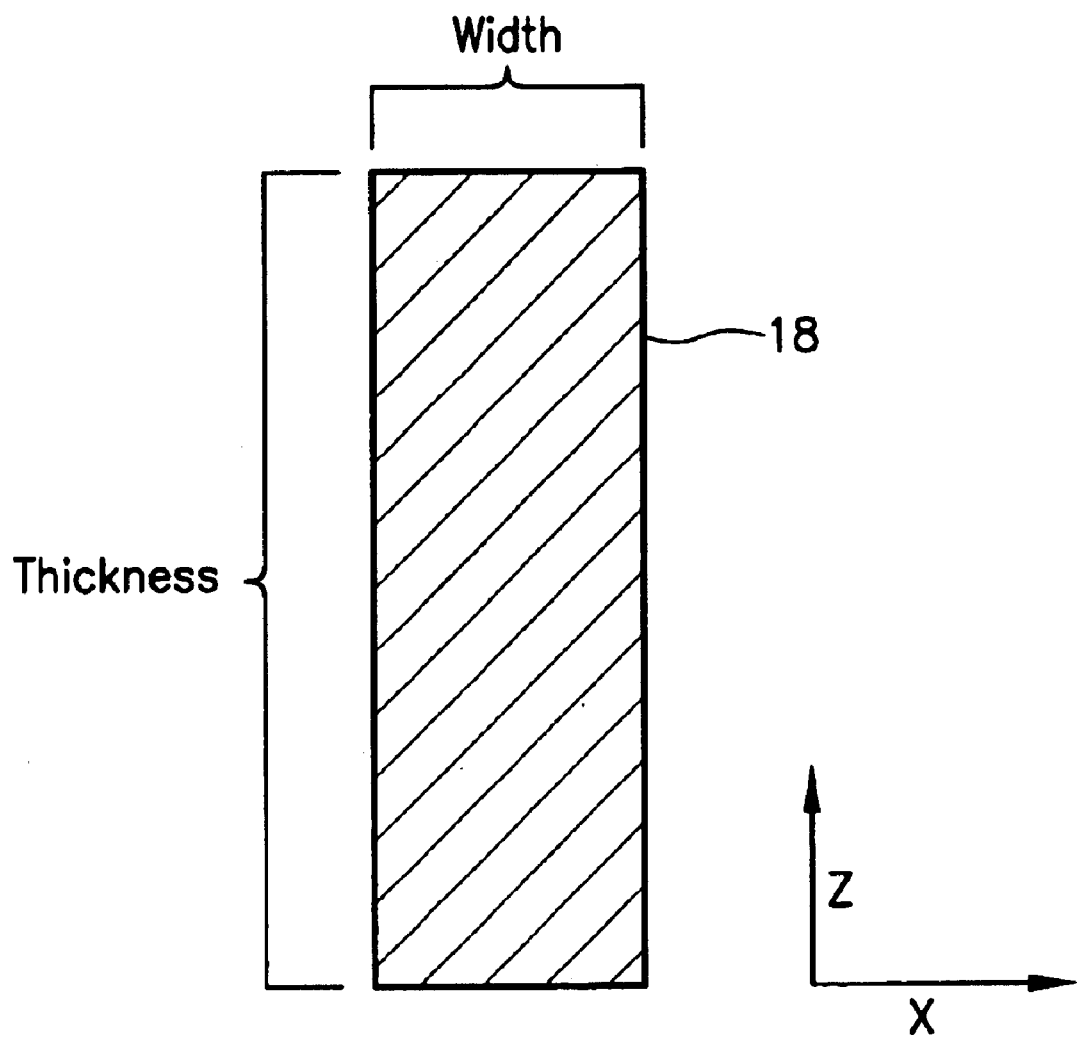
FIG. 5 depicts a cross-sectional view illustrating an aspect ratio of a spring element for an FET according to FIG. 2, or a sensor element according to FIG. 3.

The final method step, as shown in FIG. 4g, initially provides for removing oxide layer 35 through etching using hydrofluoric acid. Thereafter, the remaining parts of second photo-resist layer 34 are removed in the familiar manner using isotropic etching in an $O_2/CF_4$-plasma. Finally, through selective, wet-chemical etching, metal layer 33 is also removed.

Finally, first photo-resist layer 32 is also then removed by etching in an $O_2/CF_4$-plasma. In this context, it should be emphasized that this plasma etching process is an isotropic etching process, so that first photo-resist layer 32 in the form of a polymer sacrificial layer is also completely removed beneath gate electrode 16, which was generated.

The result of the method discussed is an anchoring point 19 that is fixedly connected to substrate 10 and an at least substantially self-supporting gate electrode 16. Furthermore, it is clear that using the above-mentioned method, it is also possible to produce undepicted springs 18 and spring structures 20, which connect gate electrode 16 to anchoring point 19. To accomplish this, it is only necessary to carry out an appropriate patterning of oxide layer 35 and of third photo-resist layer 36.

It is therefore possible in a simple manner to realize the electrical contacting of gate electrode 16 via springs 18 and anchoring points 19, which may be made of a metal such as aluminum. Furthermore, after the conclusion of the method in accordance with FIG. 4g, terminal pads 14 are again available for contacting a drain area 12 and a source area 13.

What is claimed is:

1. A field effect transistor, comprising:
   a substrate that is at least partially planar;
   a drain area;
   a source area separated from the drain area by at least one channel region, the drain area and the source area being situated within the substrate;
   a gate electrode arranged to be at least substantially self-supporting above the substrate over at least one area of the channel region, the gate electrode being flexibly supported so that an external force acting upon the gate electrode and having a component acting parallel to a surface of the substrate, deflects the gate electrode from a neutral position at least approximately parallel to the surface of the substrate in a first direction; and
   a plurality of springs coupled to the gate electrode to flexibly support the gate electrode, wherein the plurality of springs are located on a common axis and opposite each other, and wherein a thickness of the springs is substantially greater than a width of the springs, the width being measured on an axis parallel to the first direction and orthogonal to the common axis, the thickness being measured on an axis orthogonal to the first direction and orthogonal to the common axis.

2. The field effect transistor according to claim 1, wherein the drain area, the source area and the channel region each partially constitute the surface of the substrate, and the gate electrode and the channel region are separated from each other by a gap.

3. The field effect transistor according to claim 2, wherein the gap is 100-nm to 1000-nm-wide.

4. The field effect transistor according to claim 1, further comprising:
   metallic terminal pads provided on areas of the surface of the substrate, the metallic terminal pads to electrically contact the drain area and the source area.

5. The field effect transistor according to claim 1, further comprising:
   an insulating layer provided on areas of the surface of the substrate.

6. The field effect transistor according to claim 5, wherein the insulating layer is provided at least in an area of the substrate surface that is formed by the channel region.

7. The field effect transistor according to claim 1, wherein the gate electrode is connected to the substrate by at least one anchoring point.

8. The field effect transistor according to claim 1, wherein the substrate is integrated in an integrated circuit.

9. The field effect transistor according to claim 1, wherein the gate electrode is connected to the substrate via the plurality of springs so that a width of a gap between the gate electrode and the channel region remains unchanged in response to an external force that acts upon the gate electrode and that has a component that acts perpendicular to the surface of the substrate.

10. The field effect transistor according to claim 1, wherein the gate electrode is configured as a rectangle, the surface of the gate electrode, in a top view of the substrate, covering at least areas of the channel region.

11. The field effect transistor according to claim 1, wherein the gate electrode is configured so that when the gate electrode defects from the neutral position, at least one of: i) in a top view of the substrate, an overlapping surface of the area of the channel region is directly proportional to a component of the external force acting parallel to the surface of the substrate, and ii) an electrical current drawn from the drain area is directly proportional to the component of the external force acting parallel to the surface of the substrate.

12. The field effect transistor according to claim 1, wherein the gate electrode is connected to the substrate via a spring of the plurality of springs, and wherein the spring is connected to an anchoring point on the substrate via a spring structure that compensates for temperature fluctuations.

13. A sensor element, comprising:
    at least two field effect transistors arranged next to each other, each of the field effect transistors including
    a substrate that is at least partially planar,
    a drain area,
    a source area separated from the drain area by at least one channel region, the drain area and the source area being situated within the substrate,
    a gate electrode arranged to be at least substantially self-supporting above the substrate over at least one area of the channel region, the gate electrode being flexibly supported so that an external force acting upon the gate electrode and having a component acting parallel to a surface of the substrate, deflects the gate electrode from a neutral position at least approximately parallel to the surface of the substrate in a first direction;
    wherein the field effect transistors are integrated in a common integrated circuit and having a common gate electrode as an inert mass; and a plurality of springs coupled to the gate electrode to flexibly support the gate electrode, wherein the plurality of springs are located on a common axis and opposite each other, and wherein a thickness of the springs is substantially greater than a width of the springs, the width being measured on an axis parallel to the first direction and orthogonal to the common axis, the thickness being measured on an axis orthogonal to the first direction and orthogonal to the common axis.

14. An acceleration sensor, comprising:

at least two field effect transistors arranged next to each other, each of the field effect transistors including a substrate that is at least partially planar, a drain area, a source area separated from the drain area by at least one channel region, the drain area and the source area being situated within the substrate, a gate electrode arranged to be at least substantially self-supporting above the substrate over at least one area of the channel region, the gate electrode being flexibly supported so that an external force acting upon the gate electrode and having a component acting parallel to a surface of the substrate, deflects the gate electrode from a neutral position approximately parallel to the surface of the substrate, wherein a gap between the gate electrode and the channel region remains unchanged in response to the external force that acts upon the gate electrode and that has a component that acts perpendicular to the surface of the substrate in a first direction; and a plurality of springs coupled to the gate electrode to flexibly support the gate electrode, wherein the plurality of springs are located on a common axis and opposite each other, and wherein a thickness of the springs is substantially greater than a width of the springs, the width being measured on an axis parallel to the first direction and orthogonal to the common axis, the thickness being measured on an axis orthogonal to the first direction and orthogonal to the common axis.

15. The sensor element according to claim 13, wherein the common gate electrode is arranged so that under the influence of the external force that has a component acting parallel to the integrated circuit or the substrate, a sum of the a surface of the common gate electrode overlapping the channel region of a first one of the field effect transistors and the surface of the common gate electrode overlapping the channel region of a second one of the field effect transistors is constant.

16. The field effect transistor according to claim 1, wherein:

the drain area, the source area and the channel region are produced as an integrated circuit using a CMOS process.

17. The field effect transistor according to claim 1, further comprising:

a plurality of anchoring points, wherein at least one spring of the plurality of springs and at least one anchoring point of the plurality of anchoring points are generated on the integrated circuit for flexibly supporting the gate electrode above the channel region.

* * * * *